(12) United States Patent
Mantani et al.

(10) Patent No.: US 9,332,681 B2
(45) Date of Patent: May 3, 2016

(54) ELECTRONIC COMPONENT MOUNTING SYSTEM

(71) Applicant: Panasonic Intellectual Property Management Co., Ltd., Osaka (JP)

(72) Inventors: Masayuki Mantani, Yamanashi (JP); Teruaki Nishinaka, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/441,275

(22) PCT Filed: Nov. 15, 2013

(86) PCT No.: PCT/JP2013/006727
§ 371 (c)(1),
(2) Date: May 7, 2015

(87) PCT Pub. No.: WO2014/076968
PCT Pub. Date: May 22, 2014

(65) Prior Publication Data
US 2015/0289426 A1   Oct. 8, 2015

(30) Foreign Application Priority Data

Nov. 19, 2012 (JP) .................................. 2012-252959

(51) Int. Cl.
*B23K 31/02* (2006.01)
*B23K 37/00* (2006.01)
(Continued)

(52) U.S. Cl.
CPC .......... *H05K 13/0015* (2013.01); *B23K 1/0016* (2013.01); *B23K 1/20* (2013.01); *B23K 3/0638* (2013.01); *B23K 31/12* (2013.01); *H05K 3/34* (2013.01); *H05K 13/04* (2013.01); *H05K 13/0465* (2013.01); *H05K 13/08* (2013.01);
(Continued)

(58) Field of Classification Search
None
See application file for complete search history.

(56) References Cited

U.S. PATENT DOCUMENTS 6,036,994 A * 3/2000 Tanaka ................ B41F 15/0818
101/126
6,622,054 B1 * 9/2003 Okuda ............. G05B 19/41875
700/51

(Continued)

FOREIGN PATENT DOCUMENTS

JP   H04-343046 A   11/1992
JP   2004-039819 A   2/2004
(Continued)

OTHER PUBLICATIONS

International Search Report for Application No. PCT/JP2013/006727 dated Jan. 7, 2014.

*Primary Examiner* — Kiley Stoner
(74) *Attorney, Agent, or Firm* — Pearne & Gordon LLP

(57) ABSTRACT

In a case where a solder amount of a solder portion printed on an electrode does not meet a reference amount, solder is additionally applied to a center position of the electrode by a control section. With respect to a component mounting position to which the solder is not additionally applied, correction from a component mounting position of a substrate to a corrected mounting position is performed and an electronic component is mounted at the corrected mounting position. The electronic component corresponding to another component mounting position with the solder additionally applied thereto is mounted at the design component mounting position in the positioned substrate.

3 Claims, 15 Drawing Sheets

(51) Int. Cl.
    *H05K 13/00* (2006.01)
    *H05K 13/04* (2006.01)
    *H05K 13/08* (2006.01)
    *B23K 1/00* (2006.01)
    *B23K 1/20* (2006.01)
    *B23K 31/12* (2006.01)
    *B23K 3/06* (2006.01)
    *H05K 3/12* (2006.01)
    *H05K 3/34* (2006.01)

(52) U.S. Cl.
    CPC ............ *H05K 3/1216* (2013.01); *H05K 3/3484* (2013.01); *H05K 2203/04* (2013.01); *H05K 2203/163* (2013.01); *H05K 2203/166* (2013.01)

(56) References Cited

U.S. PATENT DOCUMENTS

| | | | | |
|---|---|---|---|---|
| 6,634,290 | B1* | 10/2003 | Shimizu | H05K 3/1216 101/114 |
| 6,774,931 | B1* | 8/2004 | Wachi | G01N 21/8851 348/87 |
| 6,775,899 | B1* | 8/2004 | Tomomatsu | G01N 21/95684 29/593 |
| 2006/0000872 | A1* | 1/2006 | Nakagawa | H05K 13/08 228/56.5 |
| 2006/0048383 | A1* | 3/2006 | Nishiwaki | H05K 3/0008 29/833 |
| 2008/0014772 | A1 | 1/2008 | Ogura et al. | |
| 2008/0289175 | A1* | 11/2008 | Inoue | H05K 3/303 29/840 |
| 2008/0289518 | A1* | 11/2008 | Inoue | B41F 15/0818 101/123 |
| 2009/0064489 | A1* | 3/2009 | Inoue | H05K 3/3484 29/739 |
| 2009/0202143 | A1* | 8/2009 | Mamiya | H05K 3/3484 382/150 |
| 2009/0293265 | A1* | 12/2009 | Inoue | H05K 13/08 29/739 |
| 2010/0001042 | A1* | 1/2010 | Nagai | H05K 3/341 228/102 |
| 2010/0230472 | A1* | 9/2010 | Okamoto | H05K 3/3436 228/104 |
| 2011/0023966 | A1* | 2/2011 | Watanabe | B23K 3/0638 137/1 |
| 2012/0138664 | A1* | 6/2012 | Sumioka | B41F 15/0881 228/102 |
| 2013/0087057 | A1* | 4/2013 | Kondo | H05K 3/1233 101/123 |
| 2013/0145941 | A1* | 6/2013 | Kawai | B41F 33/02 101/123 |
| 2014/0115874 | A1* | 5/2014 | Narita | B41F 15/0881 29/593 |
| 2014/0318393 | A1* | 10/2014 | Kobayashi | B41F 15/0881 101/123 |
| 2014/0373346 | A1* | 12/2014 | Okamoto | H05K 3/1233 29/825 |
| 2015/0009524 | A1* | 1/2015 | Fujimoto | B41F 15/08 358/1.14 |
| 2015/0176779 | A1* | 6/2015 | Azuma | B23K 1/0016 228/102 |
| 2015/0271963 | A1* | 9/2015 | Itoh | H05K 13/08 228/102 |
| 2015/0296670 | A1* | 10/2015 | Itoh | H05K 13/08 228/102 |
| 2015/0305213 | A1* | 10/2015 | Itoh | H05K 13/08 228/102 |
| 2015/0351295 | A1* | 12/2015 | Itoh | H05K 13/08 228/102 |

FOREIGN PATENT DOCUMENTS

| | | |
|---|---|---|
| JP | 2007-096153 A | 4/2007 |
| JP | 2007-134406 A | 5/2007 |
| JP | 2007-173855 A | 7/2007 |
| JP | 2008-072034 A | 3/2008 |
| JP | 2008-270696 A | 11/2008 |
| JP | 2010-003824 A | 1/2010 |
| JP | WO 2012096003 A1 * | 7/2012 |

* cited by examiner

FIG. 7 (a)

| SOLDER PORTION INSPECTION DATA 37 | | | | | | | |
|---|---|---|---|---|---|---|---|
| SOLDER PORTION No | REFERENCE AMOUNT | SOLDER AMOUNT | DETERMINATION | POSITION X | POSITION Y | COMPONENT MOUNTING POSITION No |
| 1001 | *** | *** | OK | *** | *** | R0023 |
| 1002 | *** | *** | OK | *** | *** | R0023 |
| 1003 | *** | *** | NG | *** | *** | C0134 |
| 1004 | *** | *** | OK | *** | *** | C0134 |
| 1005 | *** | *** | OK | *** | *** | C0136 |

FIG. 7 (b)

| CORRECTION DATA 58 | | | | | |
|---|---|---|---|---|---|
| COMPONENT MOUNTING POSITION No | X DIRECTION | Y DIRECTION | θ DIRECTION | CORRECTION VALIDITY FLAG |
| R0023 | *** | *** | *** | 1 |
| C0134 | *** | *** | *** | 0 |
| R0036 | *** | *** | *** | 1 |
| R0048 | *** | *** | *** | 1 |
| R0067 | *** | *** | *** | 1 |

FIG. 8

| COMPONENT MOUNTING DATA 59 | | | | |
|---|---|---|---|---|
| PROCESSING ORDER | X DIRECTION | Y DIRECTION | Θ DIRECTION | COMPONENT NAME |
| 1 | * * * | * * * | * * * | * * * |
| 2 | * * * | * * * | * * * | * * * |
| 3 | * * * | * * * | * * * | * * * |
| 4 | * * * | * * * | * * * | * * * |
| 5 | * * * | * * * | * * * | * * * |

FIG. 13 (a)

| SOLDER PORTION INSPECTION DATA | | | | | |
|---|---|---|---|---|---|
| SOLDER PORTION No | REFERENCE AMOUNT | SOLDER AMOUNT | DETERMINATION | COMPONENT MOUNTING POSITION No | |
| 1001 | *** | *** | OK | R0023 | |
| 1002 | *** | *** | OK | R0023 | |
| 1003 | *** | *** | NG | C0134 | |
| 1004 | *** | *** | OK | C0134 | |
| 1005 | *** | *** | OK | C0136 | |

| ADDITIONAL APPLICATION DATA | |
|---|---|
| COMPONENT MOUNTING POSITION No | ADDITIONAL APPLICATION FLAG |
| R0023 | 1 |
| C0134 | 0 |
| R0036 | 1 |
| R0048 | 1 |
| R0067 | 1 |

63

ELECTRONIC COMPONENT MOUNTING SYSTEM

TECHNICAL FIELD

The present invention relates to an electronic component mounting system which mounts electronic components on a substrate.

BACKGROUND ART

An electronic component mounting system which mounts electronic components on a substrate, thereby manufacturing a packaging substrate, is configured by connecting a plurality of apparatuses for electronic component mounting such as a solder printing apparatus which screen-prints solder on electrodes of the substrate, an electronic component mounting apparatus which holds the electronic component by a mounting head and mounts the electronic component on the electrode with the solder printed thereon, and a reflow apparatus which heats the substrate after the electronic component mounting, thereby solder-bonding the electronic component to the substrate.

The screen printing described above is performed by a squeegeeing operation of supplying solder onto a screen mask with a plurality of opening portions formed therein and sliding a squeegee on the screen mask. However, in the screen printing, there is a case where the solder printed on the electrode of the substrate becomes insufficient without satisfying a predetermined amount due to the clogging of the opening portion, or the like. For this reason, a form is known in which a print state inspection apparatus for inspecting a print state of solder provided downstream of a solder printing apparatus and correction work of additionally applying solder to a place in which it is determined that the amount of solder is insufficient, by using solder application means such as a syringe, is performed.

CITATION LIST

Patent Literature

[PTL 1] JP-A-2007-134406
[PTL 2] JP-A-2004-39819

SUMMARY OF INVENTION

Technical Problem

Incidentally, there is a case where the position of the solder printed on the electrode by the solder printing apparatus does not necessarily perfectly coincide with the position of the electrode due to a machining error or the like of the substrate or the screen mask. Therefore, in recent years, an electronic component mounting system having a function of correcting a mounting position of an electronic component based on a print position of solder printed on a substrate has been proposed. Specifically, a print position of solder is determined by inspecting the substrate after screen printing is finished, by a print state inspection apparatus, and an electronic component is mounted at the print position of solder. Thereafter, reflow is performed in a state where an electronic component is mounted on misaligned solder, whereby the electronic component is attracted to the electrode and correctly aligned due to the self-alignment effect of molten solder, and thus it is possible to realize a normal solder bond without a position shift.

However, in the above-described electronic component mounting system having a function of correcting the mounting position of an electronic component based on the print position of solder printed on the substrate, a measure for reasonably performing correction work of additionally applying solder to an electrode in which a determination that the amount of solder is insufficient is made by the print state inspection apparatus, with high productivity, is not clear. For this reason, it is not possible to combine the additional application of solder with the function of correcting the mounting position of an electronic component based on the print position of solder.

Therefore, the present invention has an object to provide an electronic component mounting system in which in an electronic component mounting system having a function of correcting a mounting position of an electronic component based on a print position of solder printed on an electrode of a substrate, it is possible to reasonably perform correction work of additionally applying solder to an electrode in which it is determined that the amount of solder is insufficient, with high productivity.

Solution to Problem

An electronic component mounting system according to the present invention includes: screen printing means that prints solder on an electrode of a circuit substrate by screen printing; solder position detection means that detects a position of the solder printed on the electrode by the screen printing means; solder amount inspection means that inspects an amount of the solder printed on the electrode by the screen printing means; mounting position correction means that obtains a correction value of a mounting position of an electronic component based on the position of the solder detected by the solder position detection means; and electronic component mounting means that mounts the electronic component at a new component mounting position corrected based on the correction value obtained by the mounting position correction means, the electronic component mounting system characterized in that the electronic component mounting system comprises solder application means that additionally applies solder at a predetermined position of the electrode regardless of an actual position of the solder with respect to the electrode in which the amount of the solder is determined to be insufficient with respect to a predetermined reference value by the solder amount inspection means, and with respect to the electronic component which is mounted on the electrode with the solder applied thereto by the solder application means, the electronic component mounting means mounts the electronic component at an original component mounting position without performing correction by the mounting position correction means.

Advantageous Effects of Invention

According to the present invention, solder application means for additionally applying solder at a predetermined position of an electrode regardless of the actual position of solder with respect to the electrode in which a determination that the amount of solder is insufficient with respect to a predetermined reference value is made by the solder amount inspection means is provided, and with respect to an electronic component which is mounted on the electrode with the solder applied thereto by the solder application means, the electronic component is mounted at the original component mounting position without performing correction by the mounting position correction means, and therefore, it is possible to achieve both high-quality packaging using a function of correcting a mounting position of an electronic component based on a print position of solder and labor saving using a function of automatically additionally applying solder to an electrode in which the amount of solder is insufficient.

BRIEF DESCRIPTION OF DRAWINGS

FIG. 7(a) is an explanatory diagram of solder portion inspection data in Embodiment 1, and FIG. 7(b) is an explanatory diagram of correction data in Embodiment 1.

FIG. 8 is an explanatory diagram of component mounting data in Embodiment 1.

FIG. 13(a) is an explanatory diagram of solder portion inspection data in Embodiment 2, and FIG. 13(b) is an explanatory diagram of additional application data in Embodiment 2.

DESCRIPTION OF EMBODIMENTS

Embodiment 1

Figure 1:
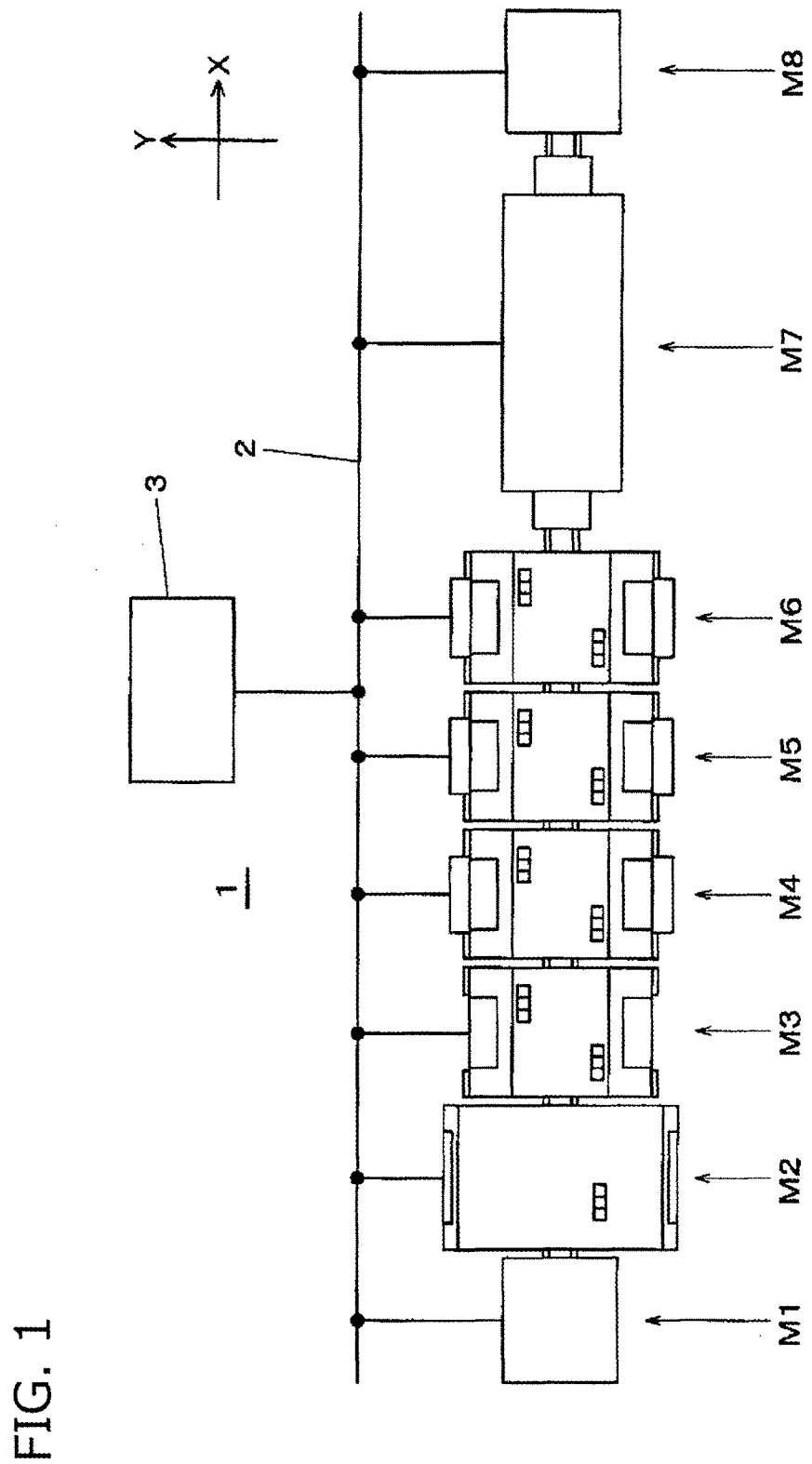
FIG. 1 is an overall configuration diagram of an electronic component mounting system in Embodiment 1.

Embodiment 1 of the present invention will be described with reference to the drawings. In FIG. 1, an electronic component mounting system has a configuration in which an electronic component packaging line 1 composed by connecting apparatuses for electronic component mounting such as a substrate supply apparatus M1, a screen printing apparatus M2, a solder application apparatus M3, electronic component mounting apparatuses M4, M5, and M6, a reflow apparatus M7, and a substrate recovery apparatus M8 in a substrate transport direction (an X direction) is connected by a communication network 2 and the entirety is controlled by a host system 3.

The substrate supply apparatus M1 is disposed at the head of the electronic component packaging line 1 and supplies a circuit substrate 4 (hereinafter referred to as a "substrate 4") (refer to FIG. 2) on which an electronic component 5 (refer to FIGS. 10(a) and 10(b)) is mounted, to the screen printing apparatus M2. The screen printing apparatus M2 prints solder on a plurality of electrodes 6 formed on the upper surface of the substrate 4, by screen printing. The solder application apparatus M3 has a function of inspecting a print state of the solder (a print position and a print amount of the solder) printed on each of the electrodes 6 of the substrate 4 and additionally applies solder onto the electrode 6 in which the print amount of solder does not meet a predetermined reference amount. The electronic component mounting apparatuses M4 to M6 (electronic component mounting means) mount the electronic component 5 on the substrate 4 with the solder printed on the electrodes 6. The reflow apparatus M7 heats the substrate 4 after the electronic component mounting, thereby melting the solder and thus solder-bonding the electronic components 5 to the substrate 4. The substrate recovery apparatus M8 recovers the substrate 4 carried out from the reflow apparatus M7.

Figure 2:
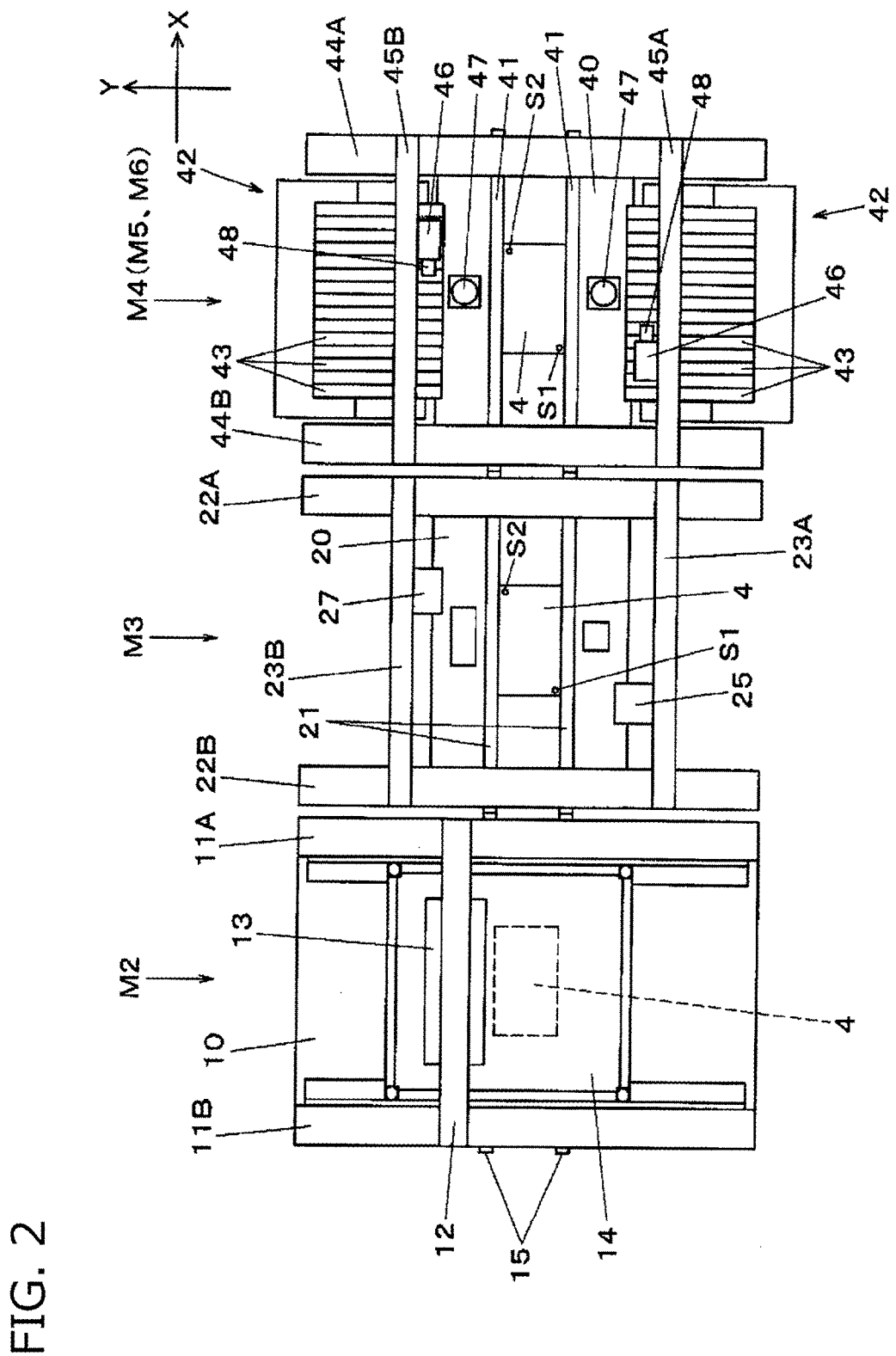
FIG. 2 is a plan view of a screen printing apparatus, a solder application apparatus, and an electronic component mounting apparatus in Embodiment 1.

Next, the details of the screen printing apparatus M2, the solder application apparatus M3, and the electronic component mounting apparatus M4 (M5 or M6) will be described with reference to FIG. 2. First, the screen printing apparatus M2 will be described. Y-axis tables 11A and 11B each provided with a linear motion mechanism by a linear motor are disposed to extend in a Y direction orthogonal to the X direction at both end portions of a base 10, and a frame member 12 extending in the X direction is spanned on the Y-axis tables 11A and 11B so as to be able to move in the Y direction. A printing head 13 at which a squeegee (not shown) extending in the X direction is provided so as to move up and down is mounted on the frame member 12, and the printing head 13 and the squeegee move in the Y direction along with the frame member 12 by driving the Y-axis tables 11A and 11B. In the above-described configuration, the Y-axis tables 11A and 11B and the frame member 12 become squeegee moving means for moving the squeegee in the Y direction.

A mask plate 14 with a plurality of pattern holes (not shown) corresponding to printing sites of the substrate 4 formed therein is provided below the printing head 13, and solder is supplied to the upper surface thereof by solder supply means such as a syringe (not shown). Further, a substrate transport mechanism 15 composed of a pair of transportation conveyors which transports the substrate 4 in the X direction is provided at a central portion of the base 10 and below the mask plate 14, and a substrate holding section (not shown) which holds the substrate 4 from below is provided between the pair of transportation conveyors so as to be able to move in the X direction, the Y direction, and a vertical direction. In addition, each mechanism described so far is operated by a control section provided in the screen printing apparatus M2.

Next, a screen printing operation will be described. The control section of the screen printing apparatus M2 moves the substrate holding section in the X and Y directions, thereby performing alignment in a plane direction with respect to the mask plate 14. Thereafter, the substrate 4 is brought into contact with the lower surface of the mask plate 14 by moving the substrate holding section up. Then, in this state, the squeegee is horizontally moved at a predetermined speed in the Y direction along the surface of the mask plate 14 with solder supplied to the upper surface thereof. In this way, the solder is screen-printed on the electrodes 6 of the substrate 4 through the pattern holes. Thereafter, the substrate 4 is transported to the solder application apparatus M3. In this manner, the screen printing apparatus M2 becomes screen printing means for printing solder on the electrodes 6 of the substrate 4 by screen printing. Hereinafter, individual solder printed for each printing site of the substrate 4 is referred to as a "solder portion 7" (refer to FIG. 4(*a*)).

Next, the solder application apparatus M3 will be described with reference to FIG. 2. A substrate transport mechanism 21 composed of a pair of transportation conveyors which transports the substrate 4 in the X direction, thereby positioning the substrate 4 at a predetermined work position (the position of the substrate 4 shown in FIG. 2), is provided to extend in the X direction at a central portion of a base 20. Further, Y-axis tables 22A and 22B each provided with a linear motion mechanism by a linear motor are provided to extend in the Y direction at both side portions of the base 20, and two X-axis tables 23A and 23B each likewise provided with a linear motion mechanism by a linear motor are spanned on the Y-axis tables 22A and 22B so as to be able to move in the Y direction.

An inspection head 25 provided with an inspection camera 24 (refer to FIG. 3) with an imaging direction directed downward is mounted on the X-axis table 23A so as to be able to move in the X direction. Further, a solder application head 27 provided with a dispenser 26 (refer to FIG. 3) which discharges solder downward is mounted on the X-axis table 23B so as to be able to move in the X direction. The inspection head 25 is moved in the X and Y directions by driving the Y-axis tables 22A and 22B and the X-axis table 23A, and the solder application head 27 is moved in the X and Y directions by driving the Y-axis tables 22A and 22B and the X-axis table 23B. In the above-described configuration, the Y-axis tables 22A and 22B and the X-axis table 23A become an inspection head moving mechanism 28 (refer to FIG. 3) which moves the inspection head 25 in the X and Y directions. Further, the Y-axis tables 22A and 22B and the X-axis table 23B become a solder application head moving mechanism 29 (refer to FIG. 3) which moves the solder application head 27 in the X and Y directions.

Next, the configuration of a control system of the solder application apparatus M3 will be described with reference to FIG. 3. A control section 30 provided in the solder application apparatus M3 is configured to include an inspection camera control section 31, a solder print state inspection section 32, an application control section 33, an application target position storage section 34, and an application amount calculation section 35. Further, the solder print state inspection section 32 is configured with a solder position inspection section 32*a* and a solder amount inspection section 32*b*. The control section 30 is connected to the inspection camera 24, the inspection head moving mechanism 28, the dispenser 26, the solder application head moving mechanism 29, the substrate transport mechanism 21, and a communication section 36 which performs transmission and reception of various types of data with the host system 3 through the communication network 2.

The inspection camera control section 31 controls the inspection camera 24 and the inspection head moving mechanism 28, thereby imaging the substrate 4 after the screen printing transported to and positioned at a predetermined work position by the substrate transport mechanism 21. The obtained imaging data of the substrate 4 is used in various inspections by the solder print state inspection section 32.

That is, the inspection camera 24 becomes inspection means for inspecting a print state of the solder printed on the electrode 6 of the substrate 4.

The solder print state inspection section 32 processes the imaging data of the substrate 4, thereby inspecting a print position and a print amount of the solder portion 7 in the substrate 4 and creating solder portion inspection data 37 (refer to FIG. 7(*a*)) based on the inspection result (the details will be described later). Hereinafter, the details of the solder print state inspection section 32 (the solder position inspection section 32*a* and the solder amount inspection section 32*b*) will be described with reference to FIGS. 4(*a*) and 4(*b*).

The solder position inspection section 32*a* processes the imaging data of the substrate 4 imaged by the inspection camera 24 and sets a certain range enclosing the electrode 6 as an inspection area E. Then, the solder portion 7 which is present in the inspection area E is detected, whereby the area thereof is calculated, and the position of the center of gravity of the calculated solder area specified as a solder position A. Then, the position of the solder portion 7 is detected by measuring an X coordinate and a Y coordinate of the solder position A in an orthogonal coordinate system based on a first recognition mark S1 and a second recognition mark S2 (refer to FIG. 2) formed at the diagonal positions of the substrate 4. That is, the solder position inspection section 32*a* and the inspection camera 24 become solder position detection means for detecting the position of the solder printed on the electrode 6 by the screen printing means.

The solder amount inspection section 32*b* measures a solder amount of each solder portion 7 based on the solder area calculated by the solder position inspection section 32*a* and checks whether or not the solder amount meets a predetermined reference amount set in advance. That is, the solder amount inspection section 32*b* and the inspection camera 24 become solder amount inspection means for inspecting the amount of the solder printed on the electrode 6 by the screen printing means. Further, the solder position detection means and the solder amount inspection means include common inspection means (the inspection camera 24).

Figure 4:
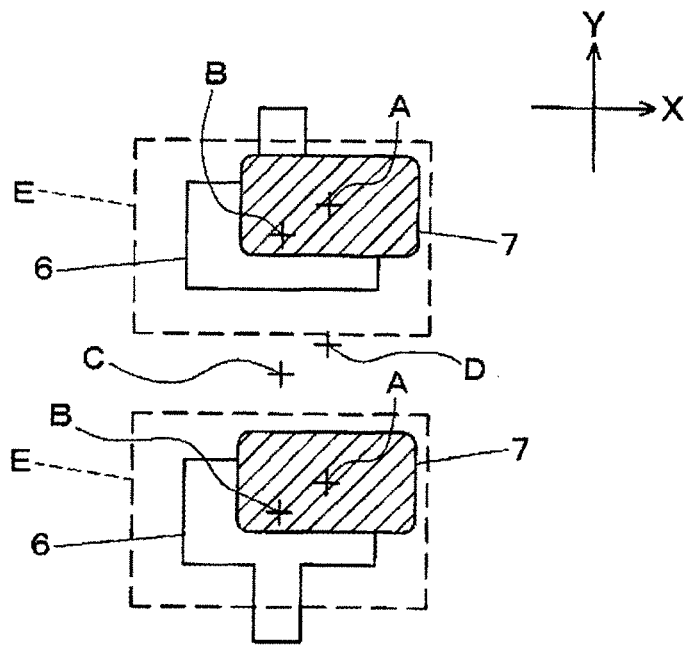
FIGS. 4(a) and 4(b) are diagrams showing print states of solder portions printed on electrodes of a substrate in Embodiment 1.
Figure 4:
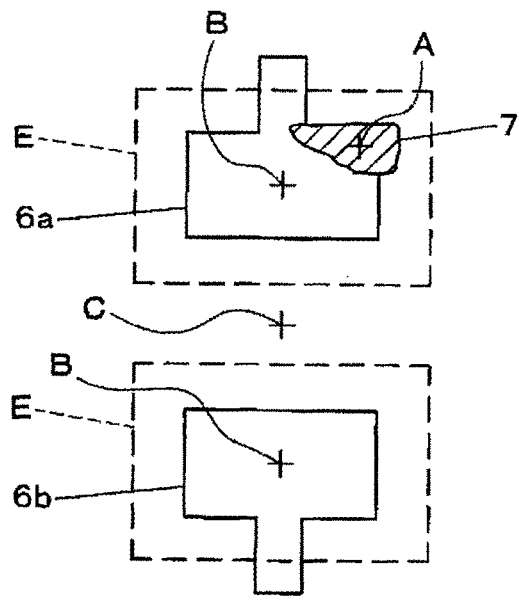

FIG. 4(*a*) shows a state where although with respect to a pair of electrodes 6, the solder portions 7 are printed to be shifted in position, the solder portion 7 is present in the inspection area E and a solder amount meets a predetermined reference amount, and thus the solder portion 7 is favorably printed. On the other hand, FIG. 4(*b*) shows a state where with respect to an electrode 6*a*, a solder amount is insufficient, and with respect to an electrode 6*b*, solder is not printed at all. With respect to the electrode 6*b*, it is determined that a printed solder amount does "not exist" and a solder position does "not exist" or is "zero". As a factor that causes such a print state, clogging of the pattern holes formed in the mask plate 14 can be considered.

Here, the solder portion inspection data 37 which is created in the solder print state inspection section 32 will be described with reference to FIG. 7(*a*). The solder portion inspection data 37 is data obtained by giving an individual number (solder portion number) to the solder portion 7 printed on each electrode 6 of the substrate 4 and making data for each substrate unit by a variety of information which includes a print state of solder for each solder portion number. That is, in the solder portion inspection data 37, information about a "reference amount" indicating a solder amount which should be printed on each solder portion number, a "solder amount" indicating a solder amount of the solder portion 7 measured by the solder amount inspection section 32*b*, a "determination" indicating acceptance or rejection of the solder amount of the solder portion 7 based on the reference amount, a "position X" and a "position Y" indicating the coordinates of the solder position A based on the first recognition mark S1, and a "component mounting position number" indicating a component mounting position of the electronic component 5 corresponding to each solder portion number is included. The solder portion inspection data 37 is transmitted from the communication section 36 to the host system 3 through the communication network 2.

Figure 3:
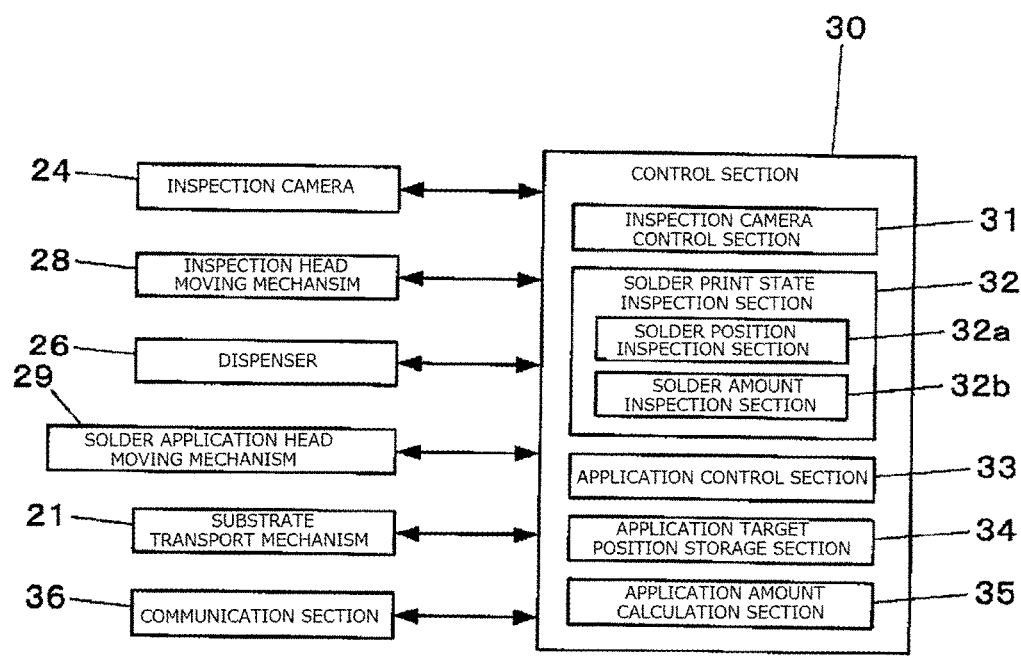
FIG. 3 is a block diagram showing the configuration of a control system of a solder inspection apparatus in Embodiment 1.

In FIG. 3, the application control section 33 controls the dispenser 26 and the solder application head moving mechanism 29, thereby additionally applying solder to a solder portion number subjected to a determination (NG) that a solder amount insufficient. The application target position storage section 34 stores a predetermined position of the electrode 6 corresponding to the solder portion 7 subjected to a determination that a solder amount is insufficient, as an application target position. Here, a center position B (refer to FIG. 4(b)) of the electrode 6 is set as an application target position. The application amount calculation section 35 calculates an additional application amount of solder to the solder portion 7 which is an additional application target, based on a solder amount shown in the solder portion inspection data 37.

In the actual work operation, the application control section 33 controls the dispenser 26 and the solder application head moving mechanism 29 so as to additionally apply solder to an application target position stored by the application target position storage section 34, that is, the center position B of the electrode 6 corresponding to the solder portion 7 subjected to a determination that a solder amount is insufficient, and discharges a solder amount calculated by the application amount calculation section 35 from the dispenser 26. Hereinafter, solder discharged from the dispenser 26 and additionally applied to the electrode 6 is referred to as "solder 7*".

Figure 5:
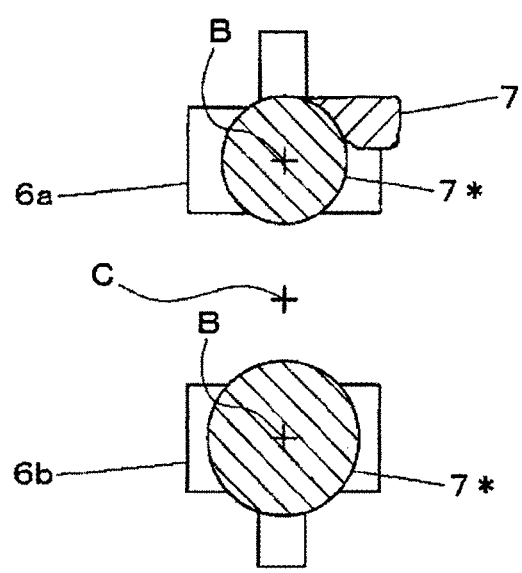
FIG. 5 is a diagram showing a state of solder additionally applied to the electrodes of the substrate in Embodiment 1.

FIG. 5 shows a state where the solder has been additionally applied to the pair of electrodes 6a and 6b (corresponding to FIG. 4(b)) in which it is determined that a solder amount is insufficient. That is, with respect to the electrode 6a in which a solder amount is insufficient, some of the solder discharged from the dispenser 26 to the solder portion 7 is applied in a state of being duplicated. On the other hand, with respect to the electrode 6b in which solder is not printed at all, a larger amount of solder 7* than the solder 7* additionally applied to the electrode 6a is additionally applied.

As described above, the application control section 33 controls the dispenser 26 and the solder application head moving mechanism 29 based on the application target position stored in the application target position storage section 34 and the additional application amount calculated by the application amount calculation section 35, thereby being able to additionally apply an appropriate amount of solder 7* with the center position B of the electrode 6 as a target regardless of the actual position of the solder portion 7. In the above-described configuration, the dispenser 26 and the solder application head moving mechanism 29 become solder application means for additionally applying solder to a predetermined position of the electrode 6 regardless of the actual position of the solder with respect to the electrode 6 in which a determination that the amount of solder is insufficient with respect to a predetermined reference value is made by the solder amount inspection means.

Next, the electronic component mounting apparatuses M4 to M6 will be described with reference to FIG. 2. A substrate transport mechanism 41 composed of a pair of transportation conveyors which transports the substrate 4 in the X direction, thereby positioning the substrate 4 at a predetermined work position (the position of the substrate 4 shown in FIG. 2), is provided to extend in the X direction at a central portion of a base 40. Component supply sections 42 are provided at both side portions of the substrate transport mechanism 41, and a plurality of tape feeders 43 for feeding the electronic components 5 are mounted on each of the component supply sections 42.

Y-axis tables 44A and 44B each provided with a linear motion mechanism by a linear motor are provided to extend in the Y direction at both side portions in the X direction of the base 40, and two X-axis tables 45A and 45B each likewise provided with a linear motion mechanism by a linear motor are spanned on the Y-axis tables 44A and 44B so as to be able to move in the Y direction. Further, a mounting head 46 provided with a suction nozzle (not shown) for suctioning and holding the electronic component 5 is mounted on each of the X-axis tables 45A and 45B so as to be able to move in the X direction. The mounting head 46 is moved in the X and Y directions by driving the Y-axis table 44 and the X-axis table 45, and thus the mounting head 46 takes out the electronic component 5 from the tape feeder 43 through the suction nozzle and moves to above the substrate 4 positioned at a predetermined work position. Then, the electronic component 5 is mounted by moving the suction nozzle down with respect to the substrate 4. In the above-described configuration, the Y-axis tables 44A and 44B and the X-axis tables 45A and 45B become mounting head moving means for moving the mounting head 46 in the X and Y directions.

A component recognition camera 47 with an imaging direction directed upward is disposed between the substrate transport mechanism 41 and the component supply section 42, and when the mounting head 46 having taken out the electronic component 5 from the component supply section 42 moves above the component recognition camera 47, the component recognition camera 47 images and recognizes the electronic component 5 in a state of being held by the suction nozzle. Further, a substrate recognition camera 48 is mounted on the mounting head 46 and moves above the substrate 4 positioned at a predetermined position along with the mounting head 46, thereby imaging and recognizing the first recognition mark S1 and the second recognition mark S2 of the substrate 4.

Next, the configurations of control systems of the host system 3 and the electronic component mounting apparatuses M4 to M6 will be described with reference to FIG. 6(a). The host system 3 is configured to include a solder portion inspection data storage section 50, a correction data creation section 51, and a correction data storage section 52. Further, a control section 53 provided in each of the electronic component mounting apparatuses M4 to M6 is configured to include a component mounting data storage section 54, a substrate recognition section 55, a component mounting coordinate calculation section 56, and a component mounting working section 57.

The solder portion inspection data storage section 50 stores the solder portion inspection data 37 which is transmitted from the communication section 36 of the solder application apparatus M3 through the communication network 2. The correction data creation section 51 creates correction data 58 (refer to FIG. 7(b)) which includes information about a correction value of a design mounting position of the electronic component 5 (a component mounting position) (the details will be described later). The correction data storage section 52 stores the correction data 58 created by the correction data creation section 51.

Here, the correction data 58 will be described with reference to FIG. 7(b). The correction data 58 is created by the correction data creation section 51 before component mounting operations by the electronic component mounting apparatuses M4 to M6. In the correction data 58, correction values in the X direction, the Y direction, and a θ direction for each component mounting position number, and information expressing whether or not to apply the correction value to correction of a component mounting position as a valid value by a flag (a correction validity flag) of "1" (validity) or "0" (invalidity) are included.

A method of creating the correction data 58 will be described. The correction data creation section 51 refers to the solder portion inspection data 37 stored in the solder portion inspection data storage section 50 and determines, from a solder position of the solder portion 7 corresponding to a component mounting position number, a corrected mounting position of an electronic component which is mounted at the component mounting position number. In the case of FIG. 4(a), the midpoint of a line segment connecting the solder positions A which are the respective centers of gravity of the pair of solder portions 7 is set to be a corrected mounting position D of an electronic component. Then, a position shift amount of the corrected mounting position D from a design component mounting position C (the midpoint of a line segment connecting the respective center positions B of the pair of electrodes 6) is calculated by referring to component mounting data 59 (refer to FIG. 8) which is stored in the component mounting data storage section 54 (described later), and thus the correction values in the X direction, the Y direction, and the θ direction are obtained. In addition, a correction value of a component mounting position number ("C0134" shown in FIG. 7(b)) which includes, even in one place, a solder portion number in which it is determined that solder is not applied at all is not calculated because a measurement result of a solder position which becomes the premise of calculation does not exist.

Further, the correction data creation section 51 gives the flag of "1" indicating the effect that correction is valid, to a component mounting position number ("R0023" shown in FIG. 7(b)) in which solder amounts of all the corresponding solder portions 7 meet a predetermined reference amount. On the other hand, to the component mounting position No. (C0134) which includes, even in one place, a solder portion number in which a solder amount does not meet a predetermined reference amount, the flag of "0" indicating the effect that correction is invalid is given.

Figure 6:
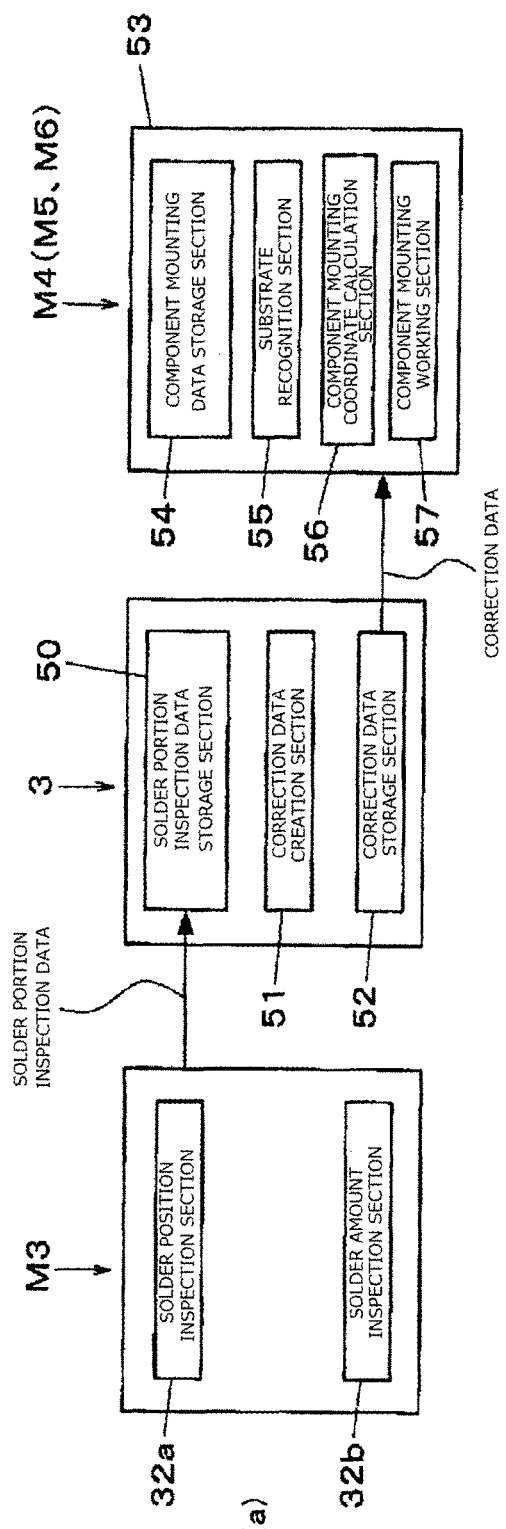
FIGS. 6(a) and 6(b) are block diagrams showing the configurations of control systems of the solder application apparatus, a host system, and the electronic component mounting apparatus in Embodiment 1.
Figure 6:
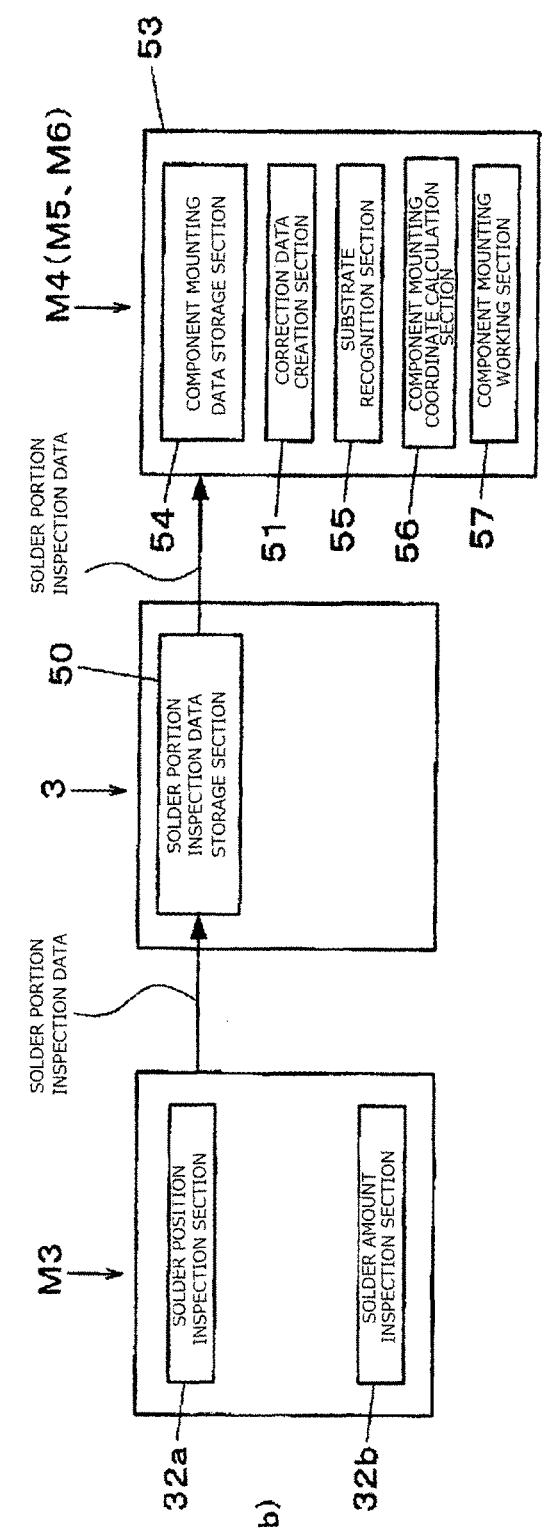

In addition, as shown in FIG. 6(b), a configuration may be made in which the correction data creation section 51 is incorporated into each of the electronic component mounting apparatuses M4 to M6 rather than the host system 3 and the correction data 58 is created based on the solder portion inspection data 37 transmitted from the host system 3. In such a case, the created correction data 58 is stored in the component mounting data 59. In short, it is favorable if the correction data 58 is created before component mounting operations in the electronic component mounting apparatuses M4 to M6. As described above, the correction data creation section 51 becomes mounting position correction means for obtaining a correction value of a mounting position of the electronic component 5 based on the position of solder detected by the solder position detection means.

The component mounting data storage section 54 stores information about the design component mounting position, more specifically, the component mounting data 59 (refer to FIG. 8) showing a coordinate value of an original component mounting position set to the substrate 4 in advance based on the position of the electrode 6, in operation processing order. That is, in the component mounting data 59, information about coordinate values in the X and Y directions indicating the design component mounting position, an angle value in the θ direction indicating the posture (the direction) of the electronic component 5, and the name (a component name) of the electronic component 5 which is a mounting target is included.

The substrate recognition section 55 detects the coordinates in the X and Y directions of the first recognition mark S1 and the second recognition mark S2 by recognizing and processing the imaging data of the first recognition mark S1 and the second recognition mark S2. Then, a position shift of the substrate 4 positioned at a predetermined work position, that is, a correction value of each component mounting position, is calculated by detecting position shift amounts (coordinates) of the first recognition mark S1 and the second recognition mark S2 in the substrate transport mechanism 41 from the detection results.

The component mounting coordinate calculation section 56 calculates a mounting coordinate of the electronic component 5 (a new component mounting position) based on the correction data 58, the component mounting data 59, and a position shift detection result of the substrate 4 by the substrate recognition section 55. That is, with respect to the component mounting position No. (R0023) with the flag of "1" given thereto in the correction data 58, a new component mounting coordinate is determined by correcting a component mounting coordinate in the component mounting data 59 based on the position shift detection result of the substrate 4 and adding a correction value in the correction data 58 to the component mounting coordinate after the correction. The new component mounting coordinate determined in this way becomes the same position as the corrected mounting position D (refer to FIG. 4(a)) in the substrate 4 positioned at the substrate transport mechanism 41.

On the other hand, with respect to the component mounting position No. (C0134) with the flag of "0" given thereto, a new component mounting coordinate is determined by converting a component mounting coordinate in the component mounting data 59 based on the position shift detection result of the substrate 4. The new component mounting coordinate determined in this way becomes the same position as the design component mounting position C (refer to FIG. 4(a)) in the substrate 4 positioned at the substrate transport mechanism 41. In addition, in a case where a correction value in the correction data 58 is made to be zero, a component mounting coordinate in the component mounting data 59 is corrected based on the position shift detection result of the substrate 4 and a correction value in the correction data 58 is added to the component mounting coordinate after the correction. The new component mounting coordinate in this case also becomes the same coordinate as that of the component mounting position C described above.

The component mounting working section 57 executes component mounting work of mounting the electronic component 5 on the substrate 4, based on the new component mounting position (component mounting coordinate) calculated by the component mounting coordinate calculation section 56. That is, the electronic component 5 is mounted by adjusting a movement amount of the mounting head 46 and moving the suction nozzle down with respect to the new component mounting position.

Figure 9:
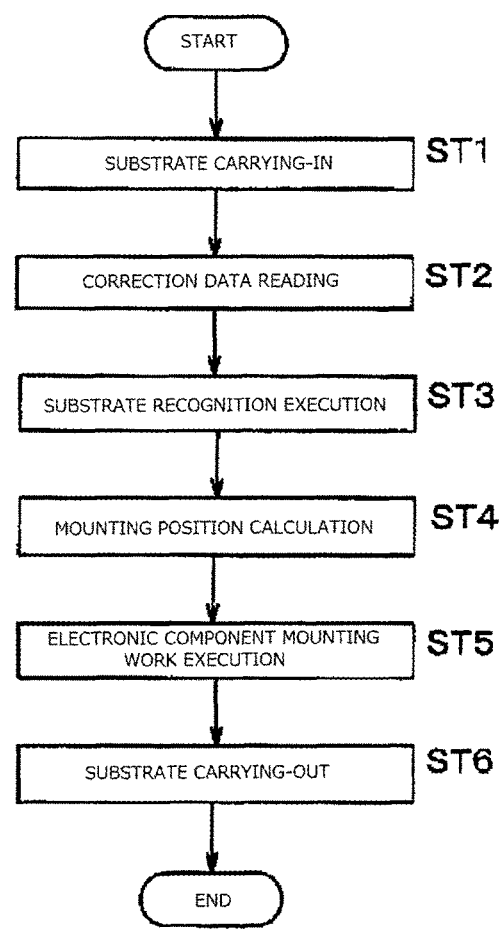
FIG. 9 is a flow diagram showing a component mounting operation in the electronic component mounting apparatus in Embodiment 1.

The electronic component mounting system according to the present invention has the configuration as described above, and next, the component mounting operation in each of the electronic component mounting apparatuses M4 to M6 will be described with reference to FIG. 9. First, the control section 53 carries in the substrate 4 with a variety of work in the screen printing apparatus M2 and the solder application apparatus M3 finished, by the substrate transport mechanism 41, and positions the substrate 4 at a predetermined work position (a substrate carrying-in process of ST1). Next, the control section 53 reads the correction data 58 corresponding to the carried-in substrate 4 from the host system 3 (the component mounting data storage section 54 in a case where the correction data 58 is created in the electronic component mounting apparatuses M4 to M6) (a correction data reading process of ST2).

Next, the control section 53 images the substrate 4 by the substrate recognition camera 48 and recognizes and processes the first recognition mark S1 and the second recognition mark S2 of the substrate 4 which are included in the obtained imaging data (a substrate recognition execution process of ST3). Then, a position shift of the substrate 4 in a state of being positioned at a predetermined work position is detected based on the recognition processing result.

Next, the control section 53 performs the calculation of a component mounting position based on the correction data 58, the component mounting data 59, and the position shift detection result of the substrate 4 (a mounting position calculation process of ST4). That is, a new component mounting coordinate is determined by determining a component mounting coordinate in a state of being positioned at a predetermined work position by using a coordinate conversion formula which is derived based on position shift amounts in two points on a plane, and adding a correction value shown in the correction data 58 to the component mounting coordinate. Here, with respect to the component mounting position No. (R0023) with the flag of "1" given thereto on the correction data, a coordinate coinciding with the corrected mounting position D in the substrate 4 positioned at a predetermined work position is determined as a new component mounting coordinate. Further, with respect to the component mounting position No. (C0134) with the flag of "0" given thereto, a coordinate coinciding with the design component mounting position C in the substrate 4 positioned likewise is determined as a new component mounting coordinate.

Next, the control section 53 mounts the electronic component 5 at the new component mounting position (coordinate) calculated in (ST4) (an electronic component mounting work execution process of ST5). That is, the component mounting position No. (R0023) to which a correction value is applied has been replaced by the corrected mounting position D, and therefore, the mounting work of the electronic component 5 is executed with respect to the corrected mounting position D (refer to FIG. 10($a$)). That is, with respect to the solder portion 7 in which a solder amount meets a predetermined reference amount, the mounting work of the electronic component 5 taking into account the position of the solder portion 7 actually printed is performed. In this manner, the electronic component mounting apparatuses M4 to M6 mount the electronic components 5 at new component mounting positions corrected based on a correction value obtained by the mounting position correction means.

Figure 10:
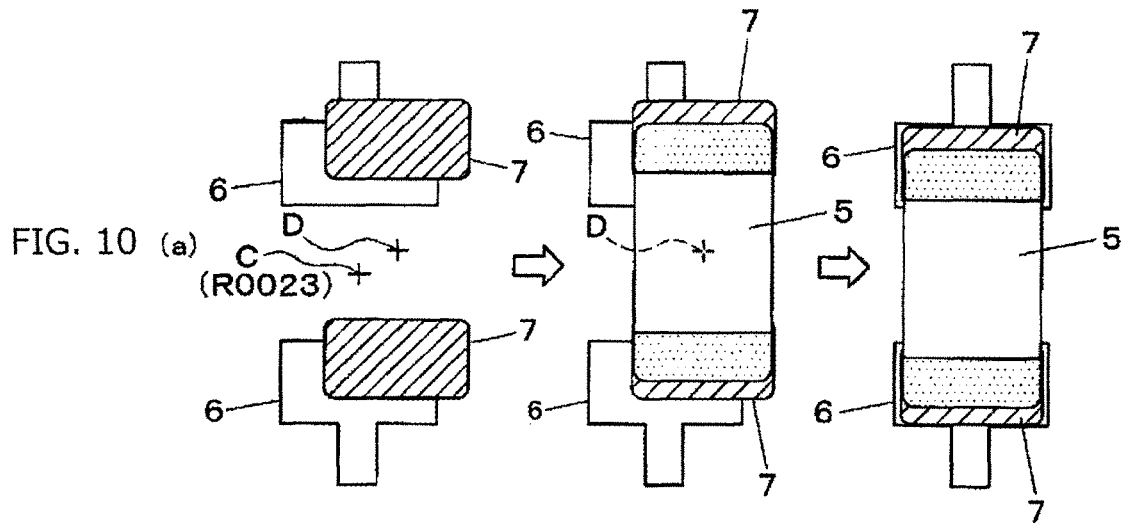
FIGS. 10(a) and 10(b) are diagrams showing states where electronic components are mounted on the electrodes of the substrate in Embodiment 1.
Figure 10:
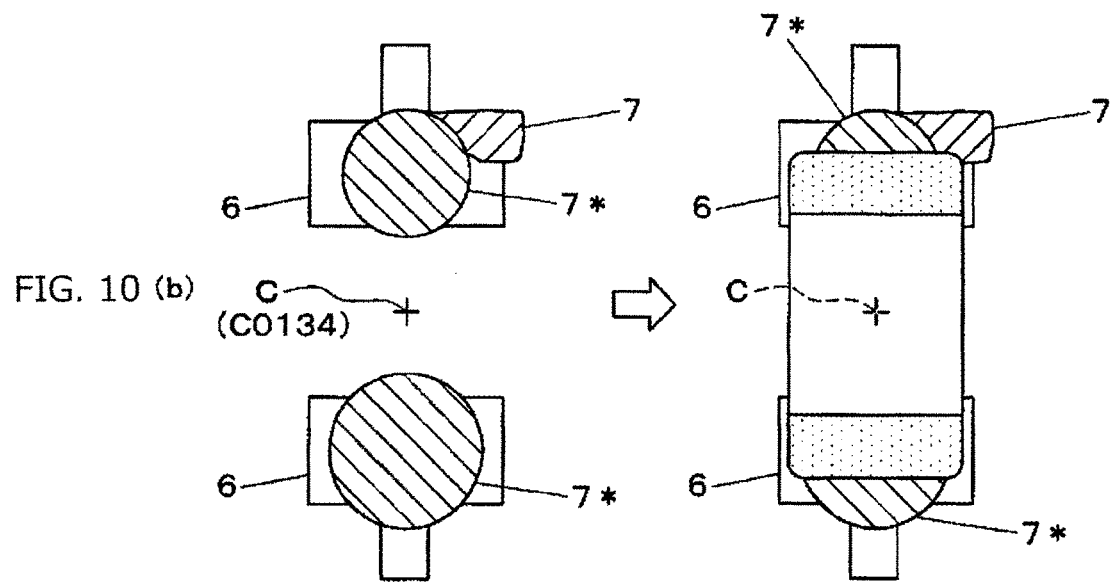

On the other hand, the electronic component 5 corresponding to the component mounting position No. (C0134) to which a correction value is not applied is mounted at the design component mounting position regardless of the position of the solder portion 7 on the substrate 4 (refer to FIG. 10($b$)). That is, with respect to the solder portion 7 in which a solder amount does not meet a predetermined reference amount, the mounting work of the electronic component 5 based on the design component mounting position C is performed. In this manner, the electronic component mounting apparatuses M4 to M6 mount the electronic components 5 which are mounted on the electrodes 6 with the solder 7* applied thereto by the solder application means, at the original component mounting positions without performing the correction by the mounting position correction means.

After the mounting work of the electronic component 5, the control section 53 carries the substrate 4 out to the downstream reflow apparatus M7 (a substrate carrying-out process of ST6). Then, the substrate 4 and the electronic component 5 are solder-bonded to each other by reflowing (heating) the substrate 4 in the reflow apparatus M7. At this time, the electronic component 5 mounted in consideration of the actual print position of the solder portion 7 is attracted to the electrode 6 by the self-alignment effect of solder which is melted, thereby being solder-bonded onto the electrode 6 (refer to FIG. 10($a$)). The substrate 4 after the reflow is recovered to the substrate recovery apparatus M8.

As described above, according to Embodiment 1, in the electronic component mounting system having a function of correcting a mounting position of an electronic component based on a print position of solder, work to additionally apply solder to an electrode in which it is determined that solder is insufficient can be reasonably performed with high productivity. Further, it is possible to achieve both high-quality packaging using a function of correcting a mounting position of an electronic component based on a print position of solder and labor saving using a function of automatically additionally applying solder to an electrode in which the amount of solder is insufficient.

Embodiment 2

Next, Embodiment 2 of the present invention will be described with reference to FIGS. 11 to 15($a$) and 15($b$). In addition, with respect to constituent elements denoted by the same reference numerals as those in Embodiment 1, description will be omitted. In this Embodiment 2, in the screen printing apparatus M2, solder is also screen-printed on the first recognition mark S1 and the second recognition mark S2 in addition to the electrode 6 of the substrate 4. That is, screen printing is executed by using the mask plate 14 in which hole portions are formed at positions corresponding to the first recognition mark S1 and the second recognition mark S2, in addition to the plurality of pattern holes corresponding to print sites of the substrate 4. Further, in electronic component mounting apparatuses M4A, M5A, and M6A, the correction of the component mounting position is performed based on the position of solder printed on each of the recognition marks S1 and S2. Hereinafter, the solder printed on the first recognition mark S1 is referred to as a "solder reference mark T1", and the solder printed on the second recognition mark S2 is referred to as a "solder reference mark T2" (refer to FIG. 15($b$)).

Figure 11:
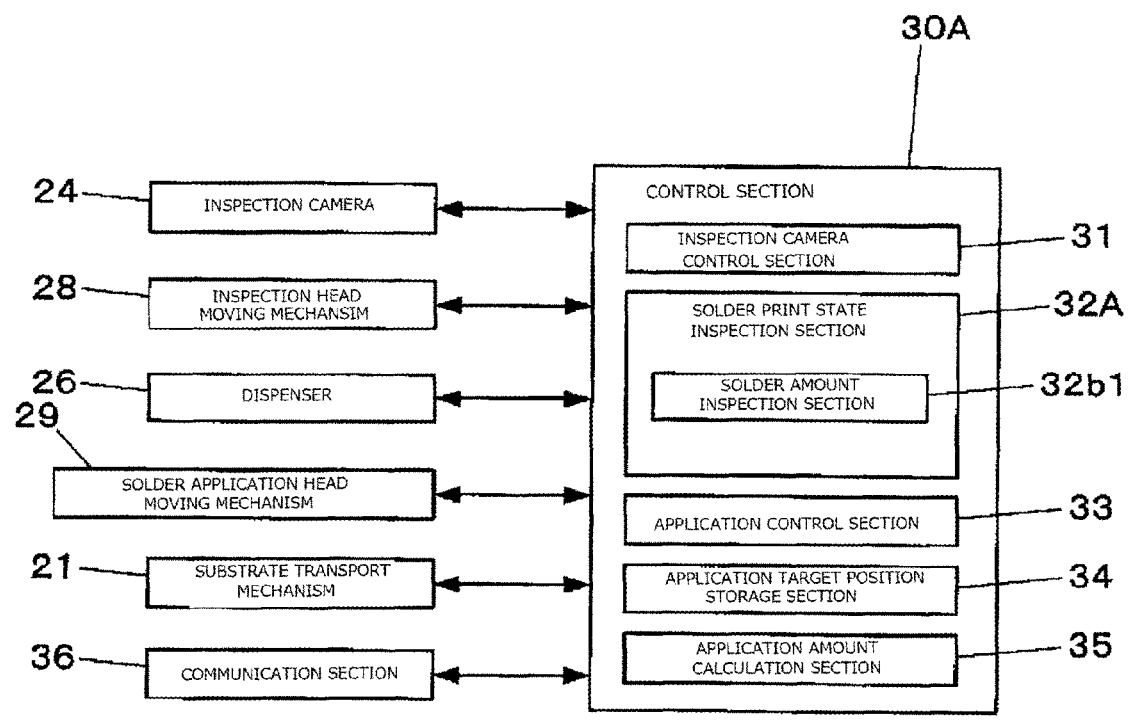
FIG. 11 is a block diagram showing the configuration of a control system of the solder application apparatus in Embodiment 2.

FIG. 11 is a block diagram showing the configuration of a control system of a solder application apparatus M3A. A solder print state inspection section 32A which a control section 30A has is configured with a solder amount inspection section 32$b$1. The solder amount inspection section 32$b$1 recognizes and processes imaging data obtained by imaging the substrate 4 by the inspection camera 24 and sets a certain range enclosing the electrode 6 as the inspection area E (refer to FIGS. 4($a$) and 4($b$)). Then, the solder portion 7 which is present in the inspection area E is detected, the area thereof is calculated, and a solder amount is measured based on a solder area. Then, whether or not the measured solder amount meets a predetermined reference amount set in advance is checked.

Solder portion inspection data 37A (refer to FIG. 13($a$)) which is created based on an inspection result by the solder amount inspection section 32*b*1 will be described. The solder portion inspection data 37A here does not include information about a solder position. That is, as shown in FIG. 13(*a*), the solder portion inspection data 37A includes information about a "reference amount" indicating the amount of solder which should be printed on each solder portion number, a "solder amount" indicating a solder amount of the solder portion 7 measured by the solder amount inspection section 32*b*1, a "determination" indicating acceptance or rejection of the printed solder amount based on the reference amount, and a "component mounting position number" indicating a mounting position of the electronic component 5 corresponding to each solder portion number.

Figure 12:
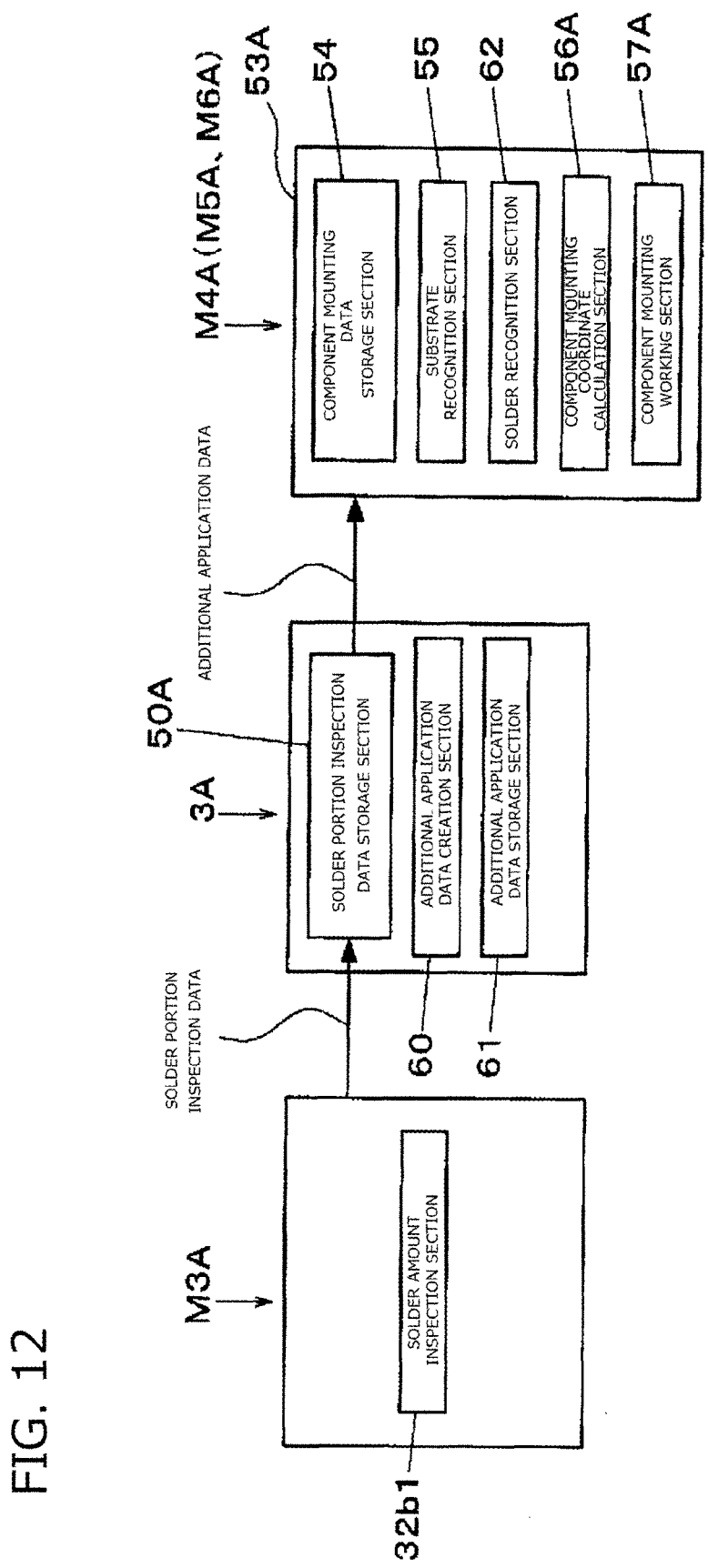
FIG. 12 is a block diagram showing the configurations of control systems of the solder application apparatus, the host system, and the electronic component mounting apparatus in Embodiment 2.

Next, the configurations of control systems of a host system 3A and the electronic component mounting apparatuses M4A to M6A will be described with reference to FIG. 12. The host system 3A is configured with a solder portion inspection data storage section 50A, an additional application data creation section 60, and an additional application data storage section 61. Further, a control section 53A of each of the electronic component mounting apparatuses M4A to M6A is configured with the component mounting data storage section 54, the substrate recognition section 55, a solder recognition section 62, a component mounting coordinate calculation section 56A, and a component mounting working section 57A.

The solder portion inspection data storage section 50A stores the solder portion inspection data 37A which is transmitted from the solder application apparatus M3A and does not include information about a solder position. The additional application data creation section 60 creates additional application data 63 (refer to FIG. 13(*b*)) which includes information expressing whether or not the additional application of the solder 7* to the electrode 6 corresponding to the component mounting position number has been performed, by a flag (an additional application flag). That is, with respect to the component mounting position No. (R0023) in which the additional application of the solder 7* to the corresponding electrode 6 has not been performed, a flag of "1" is given thereto. On the other hand, with respect to the component mounting position No. (C0134) in which the additional application of the solder 7* to the corresponding electrode 6 has been performed, a flag of "0" is given thereto.

The additional application data 63 described above is stored in the additional application data storage section 61. Further, the additional application data 63 is transmitted to the electronic component mounting apparatuses M4A to M6A through the communication network 2. In addition, a configuration may be made in which the additional application data creation section 60 is incorporated into each of the electronic component mounting apparatuses M4A to M6A and the additional application data 63 is created based on the solder portion inspection data 37A received from the host system 3A. In such a case, the created additional application data 63 is stored in the component mounting data storage section 54.

The solder recognition section 62 recognizes and processes imaging data of the solder reference marks T1 and T2 obtained by imaging the substrate 4 by the substrate recognition camera 48, thereby detecting the coordinates of the solder reference marks T1 and T2 in the substrate 4 positioned at the substrate transport mechanism 41. Then, a correction value of a component mounting coordinate calculated by the same calculation method as in the substrate recognition section 55 with the coordinates of the solder reference marks T1 and T2 being regarded as the coordinates of the first and second recognition marks and S2. In this Embodiment 2, position shift amounts of the solder reference marks T1 and T2 in a state where the substrate 4 is positioned at a predetermined work position by the substrate transport mechanism 41 are estimated to be a position shift amount of the solder portion 7 with respect to the electrode 6 and the calculation of the component mounting position (described later) is performed based on the position shift amounts. That is, the solder recognition section 62 and the substrate recognition camera 48 become solder position detection means which is provided in each of the electronic component mounting apparatuses M4A to M6A and detects the position of the solder printed on the substrate 4 before the electronic component 5 is mounted.

Figure 15A:
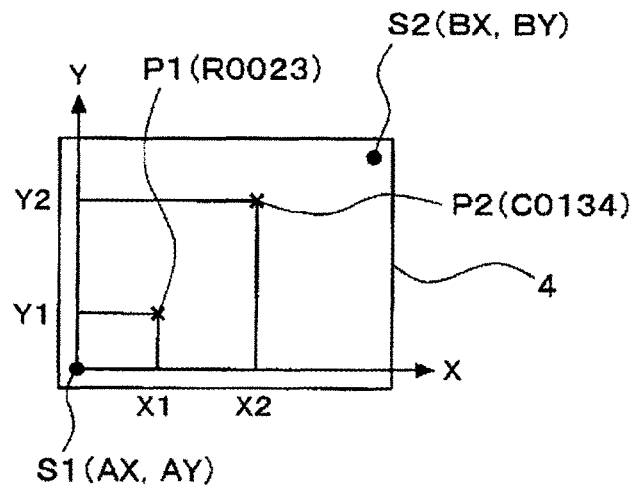
FIG. 15(a) is a diagram showing substrate data in Embodiment 2.
Figure 15B:
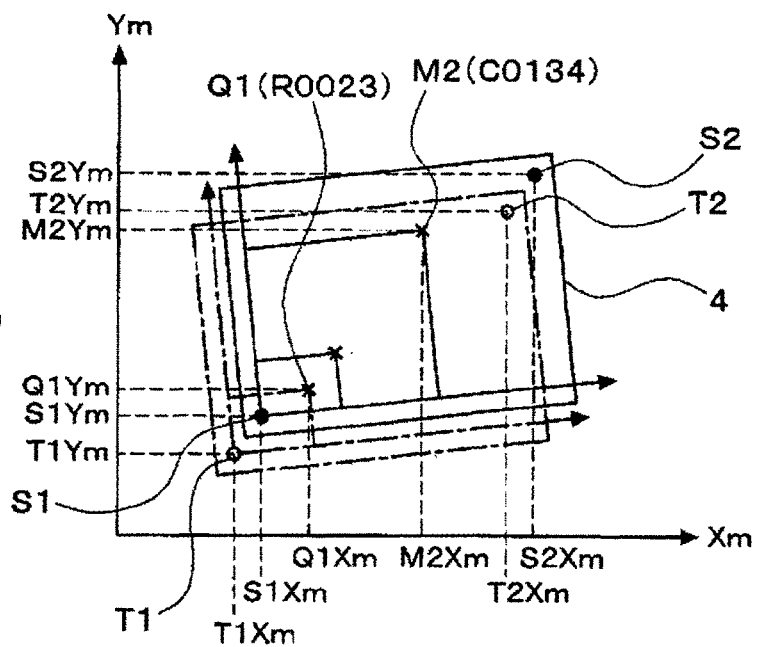
FIG. 15(b) is a diagram showing a coordinate system of the electronic component mounting apparatus in Embodiment 2.

The component mounting coordinate calculation section 56A calculates a new mounting coordinate (a new component mounting position) of the electronic component 5 based on the additional application data 63, the component mounting data 59, a position shift detection result of the substrate 4, or position shift detection results of the solder reference marks T1 and T2. Here, the new component mounting position will be described with reference to FIGS. 15(*a*) and 15(*b*). FIG. 15(*a*) shows design data of the substrate 4, wherein P1 and P2 respectively indicate the design component mounting position Nos. (R0023) and (C0134). Further, FIG. 15(*b*) shows a coordinate system of each of the electronic component mounting apparatuses M4A to M6A.

With respect to the component mounting position No. (C0134) in which the solder 7* has been additionally applied to the corresponding electrode 6, a new component mounting coordinate is determined by the same calculation as in the case of Embodiment 1. That is, the calculation of a new component mounting coordinate ("M2" shown in FIG. 15(*b*)) in which a position shift detection result (the position shift amounts of the first recognition mark S1 and the second recognition mark S2) of the substrate 4 in a state of being positioned at a predetermined work position by the substrate transport mechanism 41 is added to a component mounting coordinate ("P2" shown in FIG. 15(*a*)) on the component mounting data 59 is performed.

On the other hand, with respect to the component mounting position No. (R0023) in which the solder 7* has not been additionally applied to the corresponding electrode 6, a new component mounting coordinate is calculated by a method different from that in Embodiment 1. That is, the calculation of a new component mounting coordinate ("Q1" shown in FIG. 15(*b*)) is performed by the same processing as that in the substrate recognition execution process by substituting the coordinates of the solder reference marks T1 and T2 for the coordinates of the first recognition mark S1 and the second recognition mark S2. The new component mounting coordinate calculated in this way becomes the same position as the corrected mounting position D (refer to FIG. 4(*a*)) in the substrate 4 positioned at the substrate transport mechanism 41.

Figure 14:
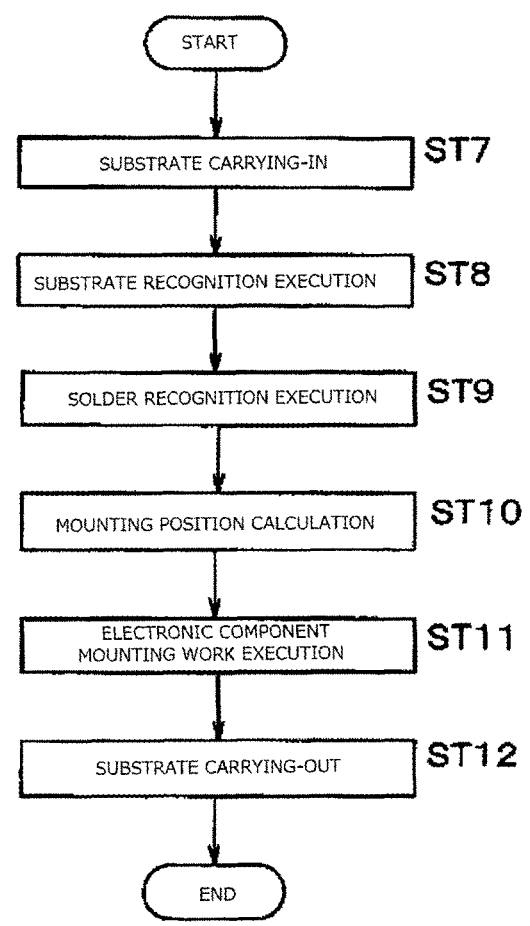
FIG. 14 is a flow diagram showing a component mounting operation in the electronic component mounting apparatus in Embodiment 2.

Next, a component mounting operation in each of the electronic component mounting apparatuses M4A to M6A will be described with reference to FIG. 14. First, the control section 53A carries in the substrate 4 with work in the screen printing apparatus M2A and the solder application apparatus M3A finished, by the substrate transport mechanism 41, and positions the substrate 4 at a predetermined work position (a substrate carrying-in process of ST7). Next, the control section 53A images the first recognition mark S1 and the second recognition mark S2 of the substrate 4 by the substrate recognition camera 48 and recognizes and processes the obtained imaging data, thereby detecting position shift of the substrate 4 in a state of being positioned at a predetermined work position (a substrate recognition execution process of ST8). Next, the control section 53A recognizes and processes the solder reference marks T1 and T2 from the above-described imaging data, thereby detecting position shift of the substrate 4 with the solder reference marks T1 and T2 being regarded as the first recognition mark S1 and the second recognition mark S2 (a solder recognition execution process of ST9).

Next, the control section 53A performs the calculation of a component mounting position based on the additional application data 63, the component mounting data 59, the position shift detection result of the substrate 4, or the position shift detection results of the solder reference marks (a mounting position calculation process of ST10). Here, with respect to the component mounting position No. (R0023) with the flag of "1" given thereto in the additional application data 63, the calculation of a new component mounting position in which the position shift amounts of the solder reference marks T1 and 12 are added to the component mounting coordinate in the component mounting data 59 is performed. On the other hand, with respect to the component mounting position No. (C0134) with the flag of "0" given thereto in the additional application data 63, the calculation of a new component mounting position in which the position shift amounts of the first recognition mark S1 and the second recognition mark S2 are added to the component mounting coordinate in the component mounting data 59 is performed.

Next, the control section 53A mounts the electronic component 5 at the new component mounting position calculated in (ST10) (an electronic component mounting work execution process of ST11). That is, with respect to the component mounting position No. (R0023), correction is performed by an amount corresponding to the position shift amounts of the solder reference marks T1 and T2 from the design component mounting position C in the positioned substrate 4, and the electronic component 5 is mounted at the position after the correction (the corrected mounting position D) (refer to FIG. 10(*a*)). That is, with respect to the solder portion 7 in which a solder amount meets a predetermined reference amount, mounting work of the electronic component 5 taking into account the print position of the solder portion 7 actually printed is performed.

On the other hand, with respect to the component mounting position No. (C0134), correction based on the position shift detection results of the solder reference marks T1 and T2 is not performed. Therefore, the electronic component 5 corresponding to the component mounting position No. (C0134) is mounted at the design component mounting position C in the positioned substrate 4 (refer to FIG. 10(*b*)). After the mounting work of the electronic component 5, the control section 53A carries the substrate 4 out to the downstream reflow apparatus M7 (a substrate carrying-out process of ST12). Then, the substrate 4 and the electronic component 5 are solder-bonded to each other by performing reflow of the substrate 4 in the reflow apparatus M7.

As described above, in this Embodiment 2, the solder reference marks T1 and T2 are regarded as the first recognition mark S1 and the second recognition mark S2 and the correction of a component mounting position is performed based on the position shift detection results of the solder reference marks T1 and T2 in the substrate 4 positioned at a predetermined work position. For this reason, although the mounting accuracy of the electronic component 5 with respect to the midpoint of a line segment connecting the respective positions of the center of gravity (the solder positions A) of the pair of solder portions 7 is slightly inferior as compared to Embodiment 1, it is possible to achieve both high-quality packaging using a function of correcting a mounting position of an electronic component with an inexpensive configuration and labor saving using a function of automatically additionally applying solder to an electrode in which the amount of solder is insufficient.

In addition, it is sufficient if the electronic component mounting system is provided with a screen printing apparatus, a solder application apparatus, and at least one electronic component mounting apparatus, and the configurations or disposition of apparatuses for electronic component mounting other than these is not limited to Embodiments 1 and 2.

Further, the design component mounting position need not necessarily be set to the midpoint of a line segment connecting the respective center positions of a pair of electrodes, and a position in the vicinity of the midpoint may be selected. In addition, also with respect to a new component mounting position based on the actual print position of a solder portion, a position other than the midpoint of a line segment connecting the respective positions of the center of gravity of a pair of solder portions may be selected. For example, an arbitrary position on a line segment connecting the design component mounting position and the midpoint may be set as the new component mounting position. In short, it is sufficient if it is a position obtained by correcting a component mounting position in consideration of the actual print position of a solder portion.

This application is based on the Japanese patent application (Patent Application No. 2012-252959) filed on Nov. 19, 2012, the contents of which are incorporated herein by reference.

INDUSTRIAL APPLICABILITY

According to the present invention, in an electronic component mounting system having a function of correcting a mounting position of an electronic component based on a print position of solder, it is possible to reasonably perform work of additionally applying solder to an electrode in which it is determined that solder is insufficient, with high productivity, and thus the present invention is useful in an electronic component packaging field of packaging electronic components on a substrate.

REFERENCE SIGNS LIST

4: circuit substrate
5: electronic component
6: electrode
7: solder portion
7*: solder
24: inspection camera
26: dispenser
29: solder application head moving mechanism
32*a*: solder position inspection section
32*b*, 32*b*1: solder amount inspection section
51: correction data creation section
62: solder recognition section
M2: screen printing apparatus
M4, M5, M6, M4A, M5A, M6A: electronic component mounting apparatus

The invention claimed is:
1. An electronic component mounting system comprising:
a screen printing unit that prints solder on an electrode of a circuit substrate by screen printing;
a solder position detection unit that detects a position of the solder printed on the electrode by the screen printing unit;

a solder amount inspection unit that inspects an amount of the solder printed on the electrode by the screen printing unit;

a mounting position correction unit that obtains a correction value of a mounting position of an electronic component based on the position of the solder detected by the solder position detection unit; and an electronic component mounting unit that mounts the electronic component at a new component mounting position corrected based on the correction value obtained by the mounting position correction unit; and a solder application unit that additionally applies solder at a predetermined position of the electrode regardless of an actual position of the solder with respect to the electrode in which the amount of the solder is determined to be insufficient with respect to a predetermined reference value by the solder amount inspection unit, wherein with respect to the electronic component which is mounted on the electrode with the solder applied thereto by the solder application unit, the electronic component mounting unit mounts the electronic component at an original component mounting position without performing correction by the mounting position correction unit.

2. The electronic component mounting system according to claim 1, wherein the solder position detection unit and the solder amount inspection unit include a common inspection unit.

3. The electronic component mounting system according to claim 1, wherein the solder position detection unit is provided in the electronic component mounting unit and detects the position of the solder printed on the circuit substrate before the electronic component is mounted.

* * * * *